United States Patent
Sonderman et al.

(10) Patent No.: US 6,821,792 B1
(45) Date of Patent: Nov. 23, 2004

(54) METHOD AND APPARATUS FOR DETERMINING A SAMPLING PLAN BASED ON PROCESS AND EQUIPMENT STATE INFORMATION

(75) Inventors: Thomas J. Sonderman, Austin, TX (US); Alexander J. Pasadyn, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 387 days.

(21) Appl. No.: 10/023,119

(22) Filed: Dec. 18, 2001

(51) Int. Cl.[7] ............................................. H01L 21/302
(52) U.S. Cl. ................. 438/5; 438/14; 216/59; 216/84; 156/345.15; 156/345.24
(58) Field of Search .................. 216/59, 84; 438/5, 438/8, 9, 14; 156/345.13, 345.15, 345.24; 118/715

(56) References Cited

U.S. PATENT DOCUMENTS

| | | | | |
|---|---|---|---|---|
| 5,982,920 A | * | 11/1999 | Tobin et al. ................. | 382/145 |
| 6,002,989 A | * | 12/1999 | Shiba et al. .................. | 702/84 |
| 6,408,219 B2 | * | 6/2002 | Lamey et al. ................ | 700/110 |
| 6,650,955 B1 | * | 11/2003 | Sonderman et al. ......... | 700/108 |
| 2002/0193899 A1 | * | 12/2002 | Shanmugasundram et al. .. | 700/108 |

* cited by examiner

Primary Examiner—George A. Goudreau
(74) Attorney, Agent, or Firm—Williams, Morgan & Amerson

(57) ABSTRACT

A processing line includes a process tool, a metrology tool, a tool state monitor, and a sampling controller. The processing tool is configured to process workpieces. The metrology tool is configured to measure an output characteristic of selected workpieces in accordance with a sampling plan. The tool state monitor is configured to observe at least one tool state variable value during the processing of a selected workpiece in the processing tool. The sampling controller is configured to receive the observed tool state variable value and determine the sampling plan for the metrology tool based on the observed tool state variable value. A method for processing workpieces includes processing a plurality of workpieces in a processing tool. A characteristic of selected workpieces is measured in accordance with a sampling plan. At least one tool state variable value is observed during the processing of a particular workpiece in the processing tool. The sampling plan is determined based on the observed tool state variable value.

34 Claims, 2 Drawing Sheets

METHOD AND APPARATUS FOR DETERMINING A SAMPLING PLAN BASED ON PROCESS AND EQUIPMENT STATE INFORMATION

BACKGROUND OF THE INVENTION

1. Field of the Invention

This invention relates generally to semiconductor device manufacturing, and, more particularly, to a method and apparatus for determining a sampling plan based on process and equipment state information.

2. Description of the Related Art

There is a constant drive within the semiconductor industry to increase the quality, reliability and throughput of integrated circuit devices, e.g, microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface that facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

Data gathered during the course of wafer processing is used to identify and attempt to mitigate the effects of process and equipment variations by implementing automatic control techniques based on the collected feedback. Current semiconductor processing techniques typically collect metrology data at a fixed rate (e.g., every fourth lot processed in a tool) or by pre-assigning a fixed percentage of lots for measurement. Because lots are not typically processed in a particular order, the percentage technique sometimes results in periods where multiple lots are measured consecutively, followed by periods where no lots are measured. Such static sampling plans sometimes do not diagnose process or system issues expeditiously. As a result defective wafers could be manufactured, necessitating costly re-work or scrapping of the wafers.

Static sampling plans also sometimes fail to provide adequate data for effective process control. For a fluctuating process, the sampling frequency may not be sufficient to provide adequate feedback for implementing a control methodology for reducing the variation. On the other hand, for a stable process, a static sampling plan may result in the collection of more data than is required, thus reducing the efficiency of the fabrication process. For a stable process, few control actions are typically taken, and the metrology data collected is generally analyzed to identify a departure from the stable condition.

The present invention is directed to overcoming, or at least reducing the effects of, one or more of the problems set forth above.

SUMMARY OF THE INVENTION

One aspect of the present invention is seen in a processing line including a process tool, a metrology tool, a tool state monitor, and a sampling controller. The processing tool is configured to process workpieces. The metrology tool is configured to measure an output characteristic of selected workpieces in accordance with a sampling plan. The tool state monitor is configured to observe at least one tool state variable value during the processing of a selected workpiece in the processing tool. The sampling controller is configured to receive the observed tool state variable value and determine the sampling plan for the metrology tool based on the observed tool state variable value.

Another aspect of the present invention is seen in a method for processing workpieces. The method includes processing a plurality of workpieces in a processing tool. A characteristic of selected workpieces is measured in accordance with a sampling plan. At least one tool state variable value is observed during the processing of a particular workpiece in the processing tool. The sampling plan is determined based on the observed tool state variable value.

BRIEF DESCRIPTION OF THE DRAWINGS

The invention may be understood by reference to the following description taken in conjunction with the accompanying drawings, in which like reference numerals identify like elements, and in which.

Figure 1:
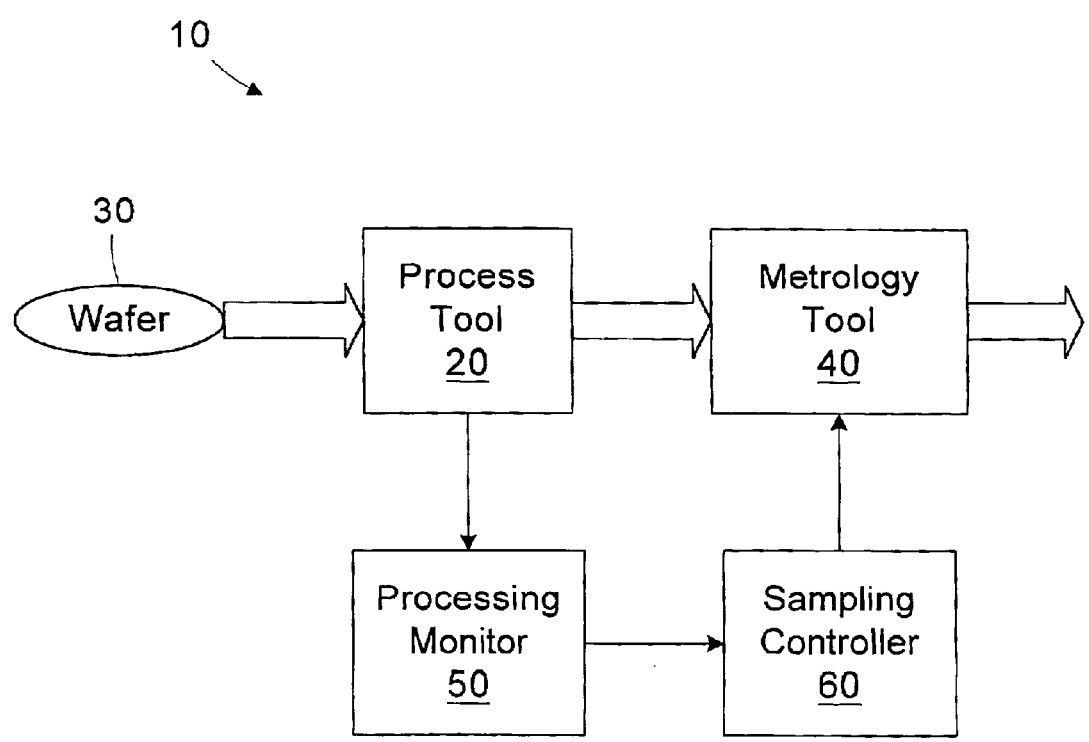
FIG. 1 is a simplified block diagram of a processing line in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to, be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Turning now to the figures, and, in particular, to FIG. 1, a simplified block diagram of a processing line 10 in accordance with one illustrative embodiment of the present invention is provided. The processing line 10 includes a processing tool 20 for processing semiconductor wafers 30 and a metrology tool 40 for measuring output characteristics of some of the wafers 30 processed by the processing tool 20 to measure the efficacy of the process implemented by the processing tool 20.

A tool state monitor 50 monitors the state of the processing tool 20 by observing the behavior of tool state variables during processes performed by the processing tool 20. A sampling controller 60 interfaces with the tool state monitor 50 and determines a sampling plan for the metrology tool 40 based on the tool state information provided by the tool state monitor 50. Although the tool state monitor 50 and sampling controller 60 are illustrated as separate units, they may be combined into a single unit in some embodiments. Also, the metrology tool 40 may be remote from the processing tool 20 as shown, or alternatively, the metrology tool 40 may be integrated with the processing tool 20 (i.e., in situ). Similarly, the sampling controller 60 may also be integrated with the metrology tool 40 and/or the tool state monitor 50 may be integrated with the process tool 20.

The particular process performed by the processing tool 20 and the particular output characteristic measured by the metrology tool 40 may vary widely. Various illustrative examples will be described in greater detail hereinafter; however, the application of the present invention is not limited to the particulars described in such examples. Rather, the instant invention is applicable to a wide variety of processing tools 20 related or not to semiconductor processing, and the output characteristic measured may be selected from a wide range of output characteristics applicable to the particular product being processed or the particular process being performed.

The sampling controller 60 determines a sampling plan for the metrology tool 40 based on the tool state information provided by the tool state monitor 50 during the processing of a wafer 30 or wafers 30 in the processing tool 20. Depending on the particular nature of the processing tool 20, it may process single wafers 30, a group or lot of wafers 30, or a plurality of lots of wafers 30 (i. e., a batch). As will be described in greater detail below, the particular sampling plan determined by the sampling controller 60 depends at least in part on the number of wafers 30 processed concurrently.

The tool state monitor 50 collects tool state data during a processing run of the processing tool 20. One processing run may be distinguished from another based on the tool state data observed during their respective runs. The particular tool state information monitored by the tool state monitor 50 depends on the specific process performed by the processing tool 20. For example, exemplary tool state data for an etch tool may include pressure, temperature, plasma power, reactant gas flow rates, etc.

The output characteristic measured by the metrology tool 40 to gauge the efficacy of the processing tool 20 may include parameters such as, but not limited to, process layer thickness, critical dimensions (e.g., line width), across-wafer variation, etc. Again, the specific output characteristic measured depends on the nature of the processing tool 20 and the particular process bring performed.

The tool state monitor 50 monitors one or more tool state variables during the processing run to differentiate between the wafers processed during different processing runs. These tool state variables affect the operation of the processing tool 20, and thus the results achieved thereby. There need not necessarily be a direct correlation between a particular tool state variable and the quality of the process performed during the run, however, in some embodiments, such a correlation may exist. For example, a relatively constant pressure value may indicate a well-performing etch process, while an increasing pressure may indicate a negative condition.

The tool state monitor 50 passes the tool state data to the sampling controller 60, which in turn, uses the tool state data to determine a sampling plan for the metrology tool 40. In a particular example, the processing tool 20 may be an etch tool adapted to etch features, such as trenches or lines, in a process layer. The metrology tool 40 may be configured to measure characteristics of the features, such as depth, width, thickness, etc. The tool state monitor 50 may monitor tool state variables, such as pressure, temperature, plasma power, reactant gas flow, etc., and the sampling controller 60 may determine a sampling plan for the metrology tool 40 based on the observed tool state variable values.

There are various techniques the sampling controller 60 may use to identify situations requiring action based on the tool state data. In one embodiment, the sampling controller 60 may use a control chart technique to identify adverse conditions associated with a single processing run (i.e., a tool state variable value exceeding a predetermined control limit). In a second embodiment, the sampling controller 60 may identify an adverse trend in the tool state data, such as an increasing tool state variable value, or a predetermined number of tool state variable values on one side of an expected value for the tool state variable. In a third embodiment, the sampling controller 60 may compare an observed value for a tool state variable to an expected value for the tool state variable and identify an action condition based on the magnitude of the difference between the observed and expected values.

The sampling controller 60 determines a sampling plan for the metrology tool 40 based on the tool state conditions observed. The tool state variable observations indicate a relatively stable process, the sampling plan may call for a reduced number of wafers to be measured by the metrology tool 40. On the other hand, if the stability of the process is less clear (e.g., control limit violation, adverse trend, expected vs. observed deviation exceeding a threshold), the sampling controller 60 may institute a sampling plan that calls for increased gathering of metrology feedback data.

In another embodiment, the sampling controller 60 may group the tool state variable values it receives from the tool state monitor 50 into bins based on their magnitudes (i.e., each bin encompasses a range of tool state variable values). Each bin may have its own associated sampling plan. After receiving the tool state data from the tool state monitor 50, the sampling controller 60 determines which bin encompasses the wafer(s) processed by the processing tool 20 and accesses the predetermined sampling plan for that bin.

The specific detail for the sampling plans may be developed based on historical data collected regarding the characteristics of the wafers in each bin. For example, if a particular bin normally has an associated output characteristic that has been historically stable, the sampling plan may specify that a reduced number of wafers associated with the bin be sampled by the metrology tool 40. However, if the particular bin has been determined to be less stable or of lower quality, the sampling plan may dictate that an increased number of wafers be measured.

The scale on which the sampling plan is implemented depends on the particular nature of the processing tool 20. If the processing tool 20 processes single wafers 30, the sampling plan may specify the frequency at which subsequent wafers 30 processed by the processing tool 20 are measured by the metrology tool 40. In another embodiment, if the processing tool 20 processes lots or batches (i.e., multiple lots) of wafers 30, the sampling plan may specify the number of wafers 30 in the current lot or batch that is to be measured. For example, for a lot or batch with a tool state variable value indicating a higher expected degree of stability or quality, the metrology tool 40 may measure 10% of the wafers 30, while for a lot or batch with a lower expected degree of stability or quality, the metrology tool 40 may measure 30% of the wafers 30.

Figure 2:
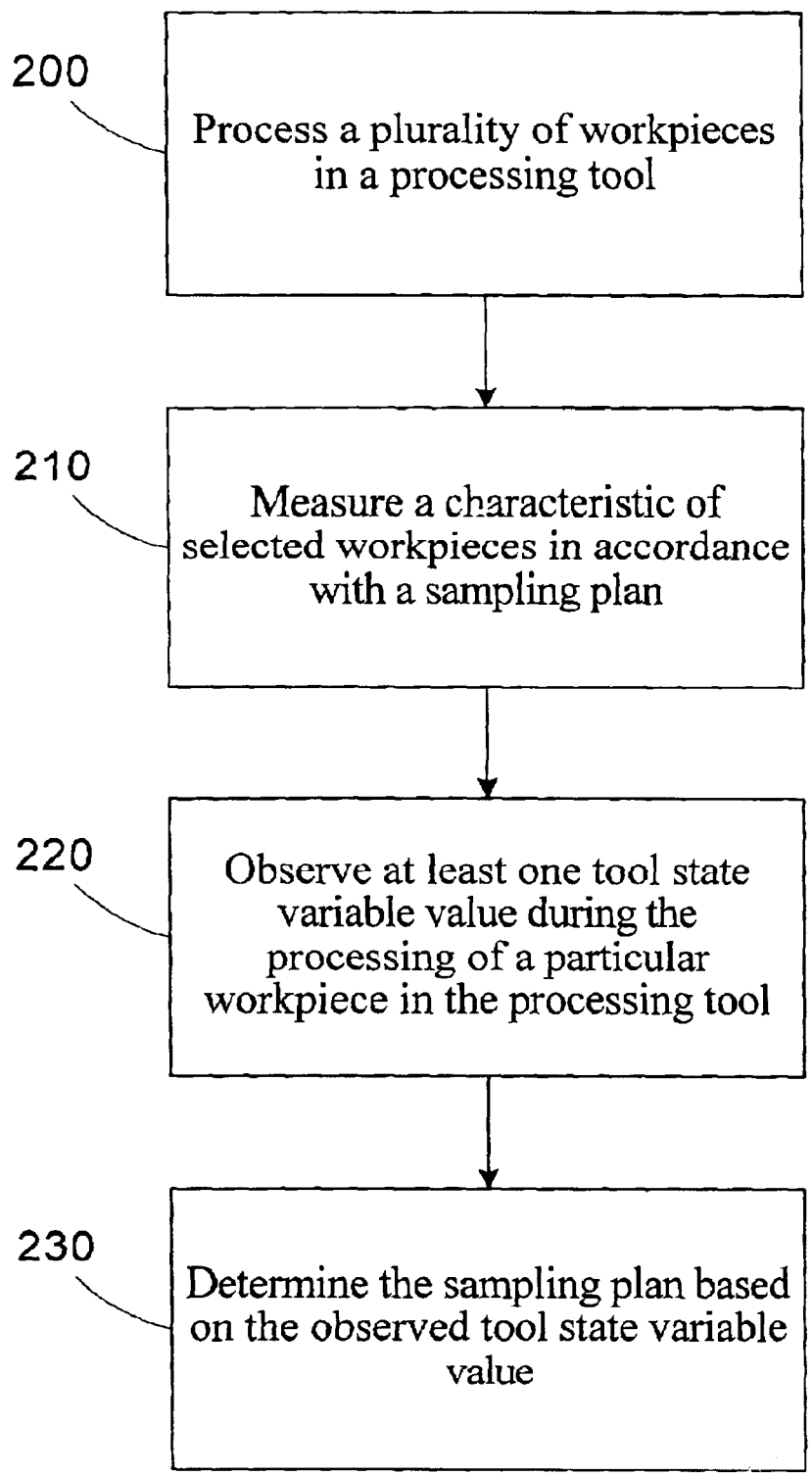
FIG. 2 is a flow diagram of a method for determining a sampling plan based on process and equipment state information in accordance with another illustrative embodiment of the present invention.

Turning now to FIG. 2, a flow diagram of a method for determining a sampling plan based on process and equipment state information in accordance with another illustrative embodiment of the present invention is provided. In block 200, a plurality of workpieces is processed in a processing tool. In block 210, a characteristic of selected workpieces is measured in accordance with a sampling plan. In block 220, at least one tool state variable value is observed during the processing of a particular workpiece in the processing tool. In block 230, the sampling plan is determined based on the observed tool state variable value.

In general, adaptively changing the sampling plan implemented by the metrology tool 40, as described above, increases the efficiency of the processing line 10. For stable processes, the amount of metrology resources expended may be reduced. This reduction increases the throughput of the processing line 10. In situations where stability is decreased, the amount of metrology data collected may be increased to facilitate better process control and/or fault detection and correction. Changes in the sampling plans may be used to trigger an alert or message to an operator of the processing tool 20 to evaluate the changing conditions and possibly schedule a maintenance task.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A processing line, comprising:
    a processing tool configured to process workpieces;
    a metrology tool configured to measure an output characteristic of selected workpieces in accordance with a sampling plan;
    a tool state monitor configured to observe at least one tool state variable value during the processing of a selected workpiece in the processing tool; and
    a sampling controller configured to receive the observed tool state variable value and determine the sampling plan for the metrology tool based on the observed tool state variable value.

2. The processing line of claim 1, wherein the sampling controller is further configured to compare the observed tool state variable value to a predetermined threshold and change the sampling plan responsive to the observed tool state variable value exceeding the predetermined threshold.

3. The processing line of claim 1, wherein the sampling controller is further configured to identify a trend in the observed tool state variable values associated with the processing of a plurality of workpieces and change the sampling plan responsive to identifying the trend.

4. The processing line of claim 1, wherein the sampling controller is further configured to generate an expected tool state variable value associated with the processing of the particular workpiece, compare the expected tool state variable value to the observed tool state variable value, and determine the sampling plan based on the comparison.

5. The processing line of claim 1, wherein the sampling controller is configured to define a plurality of bins, each bin having an associated range of tool state variable values, associate the observed tool state variable value wvith one of the bins having a range encompassing the observed tool state variable value, and determine the sampling plan based on the associated bin.

6. The processing line of claim 1, wherein the processing tool is configured to process single workpieces, and the sampling plan comprises a sampling frequency for measuring subsequent workpieces processed in the processing tool.

7. The processing line of claim 1, wherein the processing tool is configured to concurrently process a set of workpieces, and the sampling plan comprises a number of workpieces in the set to be measured by the metrology tool.

8. The processing line of claim 1, wherein the workpieces comprise semiconductor wafers.

9. A processing line, comprising:
an etch tool configured to etch process layers;
a metrology tool configured to measure an output characteristic of selected etched process layers in accordance with a sampling plan;
a tool state monitor configured to observe at least one tool state variable value during the etching of a particular process layer in the etch tool; and
a sampling controller configured to receive the observed tool state variable value and determine the sampling plan for the metrology tool based on the observed tool state variable value.

10. The processing line of claim 9, wherein the sampling controller is further configured to compare the observed tool state variable value to a predetermined threshold and change the sampling plan responsive to the observed tool state variable value exceeding the predetermined threshold.

11. The processing line of claim 9, wherein the sampling controller is further configured to identify a trend in the observed tool state variable values associated with the processing of a plurality of process layers and change the sampling plan responsive to identifying the trend.

12. The processing line of claim 9, wherein the sampling controller is further configured to generate an expected tool state variable value associated with the processing of the particular process layer, compare the expected tool state variable value to the observed tool state variable value, and determine the sampling plan based on the comparison.

13. The processing line of claim 9, wherein the sampling controller is configured to define a plurality of bins, each bin having an associated range of tool state variable values, associate the observed tool state variable value with one of the bins having a range encompassing the observed tool state variable value, and determine the sampling plan based on the associated bin.

14. The processing line of claim 9, wherein the sampling plan comprises a sampling frequency for measuring subsequent process layers processed in the etch tool.

15. The processing line of claim 9, wherein the sampling plan comprises a number of process layers in a set of wafers on which the process layers are formed to be measured by the metrology tool.

16. The processing line of claim 9, wherein the tool state variable value comprises at least one of a pressure value, a temperature value, a plasma power value, and a reactant gas flow rate value.

17. A method for processing workpieces, comprising:
processing a plurality of workpieces in a processing tool;
measuring a characteristic of selected workpieces in accordance with a sampling plan;
observing at least one tool state variable value during the processing of a particular workpiece in the processing tool; and
determining the sampling plan based on the observed tool state variable value.

18. The method of claim 1, wherein determining the sampling plan further comprises:
comparing the observed tool state variable value to a predetermined threshold; and
changing the sampling plan responsive to the observed tool state variable value exceeding the predetermined threshold.

19. The method of claim 17, wherein determining the sampling plan further comprises:
identifying a trend in the observed tool state variable values associated with the processing of a plurality of workpieces; and
changing the sampling plan responsive to identifying the trend.

20. The method of claim 17, wherein determining the sampling plan further comprises:
generating an expected tool state variable value associated with the processing of the particular workpiece;
comparing the expected tool state variable value to the observed tool state variable value; and
determining the sampling plan based on the comparison.

21. The method of claim 17, wherein determining the sampling plan further comprises:
defining a plurality of bins, each bin having an associated range of tool state variable values;
associating the observed tool state variable value with one of the bins having a range encompassing the observed tool state variable value; and
determining the sampling plan based on the associated bin.

22. The method of claim 17, wherein the processing tool is configured to process single workpieces, and determining the sampling plan further comprises determining a sampling frequency for measuring subsequent workpieces processed in the processing tool.

23. The method of claim 17, wherein the processing tool is configured to concurrently process a set of workpieces, and determining the sampling plan further comprises determining a number of workpieces in the set to be measured by the metrology tool.

24. The method of claim 17, wherein processing the plurality of workpieces further comprises processing a plurality of semiconductor wafers.

25. A method for processing wafers, comprising:
etching a plurality of process layers;
measuring an output characteristic of the etched process layers in accordance with a sampling plan;
observing at least one tool state variable value during the etching of a particular process layer; and
determining the sampling plan based on the observed tool state variable value.

26. The method of claim 25, wherein determining the sampling plan further comprises:
comparing the observed tool state variable value to a predetermined threshold; and changing the sampling plan responsive to the observed tool state variable value exceeding the predetermined threshold.

27. The method of claim 25, wherein determining the sampling plan further comprises:
identifying a trend in the observed tool state variable values associated with the processing of a plurality of process layers; and
changing the sampling plan responsive to identifying the trend.

28. The method of claim 25, wherein determining the sampling plan further comprises:
generating an expected tool state variable value associated with the processing of the particular process layer;
comparing the expected tool state variable value to the observed tool state variable value; and
determining the sampling plan based on the comparison.

29. The method of claim 25, wherein determining the sampling plan further comprises:
defining a plurality of bins, each bin having an associated range of tool state variable values;
associating the observed tool state variable value with one of the bins having a range encompassing the observed tool state variable value; and
determining the sampling plan based on the associated bin.

30. The method of claim 25, wherein determining the sampling plan further comprises determining a sampling frequency for measuring subsequent process layers processed in the etch tool.

31. The method of claim 25, wherein determining the sampling plan further comprises determining a number of process layers in a set of wafers on which the process layers are formed to be measured by the metrology tool.

32. The method line of claim 25, wherein observing the tool state variable value comprises observing at least one of a pressure value, a temperature value, a plasma power value, and a reactant gas flow rate value.

33. A processing line, comprising:
means for processing a plurality of workpieces;
means for measuring a characteristic of selected workpieces in accordance with a sampling plan;
means for observing at least one tool state variable value during the processing of a particular workpiece; and
means for determining the sampling plan based on the observed tool state variable value.

34. A processing line, comprising:
means for etching process layers;
means for measuring an output characteristic of the etched process layers in accordance with a sampling plan;
means for observing at least one tool state variable value during the etching of a particular process layer; and
means for determining the sampling plan based on the observed tool state variable value.

* * * * *